US012409676B2

(12) United States Patent
Nees et al.

(10) Patent No.: US 12,409,676 B2
(45) Date of Patent: Sep. 9, 2025

(54) ELASTIC EMBOSSING LACQUER HAVING HIGH OPTICAL DISPERSION

(71) Applicant: Joanneum Research Forschungsgesellschaft mbH, Graz (AT)

(72) Inventors: Dieter Nees, Thannhausen (AT); Ursula Palfinger, Albersdorf-Prebuch (AT); Stephan Ruttloff, Anger (AT); Johannes Götz, Gleisdorf (AT)

(73) Assignee: JOANNEUM RESEARCH FORSCHUNGSGESELLSCHAFT MBH, Graz (AT)

( * ) Notice: Subject to any disclaimer, the term of this patent is extended or adjusted under 35 U.S.C. 154(b) by 221 days.

(21) Appl. No.: 17/957,074

(22) Filed: Sep. 30, 2022

(65) Prior Publication Data

US 2023/0107543 A1  Apr. 6, 2023

(30) Foreign Application Priority Data

Oct. 4, 2021  (EP) ..................... 21200658

(51) Int. Cl.
  *C09D 133/14*  (2006.01)
  *B44C 1/24*  (2006.01)
(52) U.S. Cl.
  CPC .............. *B44C 1/24* (2013.01); *C09D 133/14* (2013.01)
(58) Field of Classification Search
  CPC ......... B44C 1/24; A44C 27/005; G03F 7/027; G03F 7/0002
  See application file for complete search history.

(56) References Cited

U.S. PATENT DOCUMENTS

2006/0103038 A1   5/2006  Su et al.
2009/0197986 A1*  8/2009  Lee .................... G02B 1/04
                                                          524/199

(Continued)

FOREIGN PATENT DOCUMENTS

CN    106433545 A      2/2017
CN    109597243 A  *   4/2019
JP     3982744 B2 *    9/2007

(Continued)

OTHER PUBLICATIONS

Espacenet Translation of CN 109597243 A (Year: 2024).*
European Patent Office, Partial European Search Report issued in European Patent Application No. 21200658.9 on Apr. 19, 2022.

*Primary Examiner* — Michael M Dollinger
(74) *Attorney, Agent, or Firm* — Duane Morris LLP

(57) ABSTRACT

An embossing lacquer containing radical polymerizable compounds (A) to (D) that have an overall aromatic content of at least 20 wt %: compound (A), which is a non-crosslinking compound and has an aromatic content of at least 40 wt %; compound (B), which is a crosslinking compound forming crosslinks via one or more aliphatic chain(s) each having a molecular weight of 200 to 2000 g/mol, wherein the content of the aliphatic chain(s) in compound (B) is at least 40 wt %; optionally compound (C), which is a crosslinking compound and has an aromatic content of at least 30 wt %; and optionally compound (D), which has a urethane group. A decorative article containing the cured embossing lacquer and a method of preparing the decorative article.

14 Claims, 2 Drawing Sheets

(56) References Cited

U.S. PATENT DOCUMENTS

2013/0004676 A1 1/2013 Ha
2017/0349707 A1 12/2017 Nees et al.

FOREIGN PATENT DOCUMENTS

| KR | 2017079445 A | * | 7/2017 | ............ G03F 7/027 |
| WO | 2011016651 A2 | | 2/2011 | |
| WO | 2021137091 A1 | | 7/2021 | |

* cited by examiner

ELASTIC EMBOSSING LACQUER HAVING HIGH OPTICAL DISPERSION

FIELD OF THE INVENTION

The present invention relates to an embossing lacquer, a method of preparing a polymerized embossing lacquer, a polymerized embossing lacquer, a decorative article, and a method of preparing a decorative article.

BACKGROUND ART

WO 2021/009381 A1 discloses decorative articles having a visual appearance and optical properties closely comparable to those of a decorative crystal component or gemstone. The decorative articles may comprise a support and a layer having a microstructure surface. The microstructures may be obtained by embossing and curing a layer of an embossing lacquer. They comprise a plurality of grooves creating a continuous pattern of facets, such that the facets are capable of splitting incident light into spectral colours. The facets may produce interesting optical effects including reflection and refraction at different angles, and possibly depending on the wavelength of the light. The advantageous optical effects are achieved by using an embossing lacquer having a high aromatic content and thus high optical dispersion.

Problem to be Solved by the Invention

The microstructure layers disclosed in WO 2021/009381 A1 are composed of crosslinked polymers having low elasticity. Hence, the decorative articles containing these microstructure layers cannot be used in applications requiring high elasticity such as applications on textiles. In light of these deficiencies, the problem underlying the present invention was to provide an embossing lacquer resulting in a polymer having both high optical dispersion and high elasticity.

SUMMARY OF THE INVENTION

The problem underlying the present invention was solved by providing an embossing lacquer having a high aromatic content and containing polymerizable compounds capable of forming a polymer main chain and polymerizable compounds having long flexible aliphatic or polyether moieties capable of crosslinking the polymer main chains forming an elastic polymer network.

The present application covers the following points [1] to [15].

[1] An embossing lacquer containing a total of 100 parts by weight of the following radical polymerizable compounds (A) to (D) that have an overall aromatic content of at least 20 wt %:
  20 to 80 parts by weight of compound (A), which is a non-crosslinking compound in a radical polymerization reaction and has an aromatic content of at least 40 wt %,
  10 to 60 parts by weight of compound (B), which is a crosslinking compound in a radical polymerization reaction forming crosslinks via one or more, preferably unbranched and saturated, aliphatic chain(s) each having a molecular weight of 120 to 2000 g/mol, preferably 200 to 2000 g/mol and each being selected from the group consisting of polyether, polythioether, polyester, polythioester, polyacetate, polycarbonate, and hydrocarbon, wherein the content of the aliphatic chain(s) in compound (B) is at least 40 wt %,
  0 to 50 parts by weight of compound (C), which is a crosslinking compound in a radical polymerization reaction and has an aromatic content of at least 30 wt % and does not fall within the definition of compound (B), and
  0 to 10 parts by weight of compound (D), which does not fall within the definition of any of compounds (A) to (C) and has a urethane group.

[1-1] Preferably, compounds (A) to (D) constitute at least 90 wt % of the embossing lacquer of point [1]. [1-2] Preferably, compounds (A) to (D) have an overall aromatic content of at least 25 wt % in the embossing lacquer of point [1]. [1-3] Preferably, the one or more aliphatic chain(s) is/are polyether(s) in compound (B) of the embossing lacquer of point [1]. [1-4] A combination of the features of [1-1] and [1-2] is preferred. [1-5] A combination of the features of [1-1], [1-2], and [1-3] is more preferred.

[2] The embossing lacquer according to any of points [1] to [1-5], wherein compound (A) contains a single polymerizable carbon-carbon double bond and compound (B) contains two or more polymerizable carbon-carbon double bonds.

[2-1] A combination of the features of [1-4] and [2] is preferred. [2-2] A combination of the features of [1-5] and [2] is more preferred.

[3] The embossing lacquer according to any of the preceding points [1] to [2-2], wherein the aromatic content in compounds (A) to (D) is constituted by phenyl groups.

[4] The embossing lacquer according to any of the preceding points, wherein compound (B) contains two polyether chains as the aliphatic chains, wherein the two polyether chains are separated by a moiety containing at least two aromatic groups.

[5] The embossing lacquer according to any of the preceding points, wherein compound (A) has at least two aromatic groups and a molecular weight of less than 350 g/mol, compound (B) has a molecular weight of 600 g/mol to 2000 g/mol and contains two polyether chains as the aliphatic chains, wherein the two polyether chains are separated by a residue containing two aromatic groups, and compound (C) has at least two aromatic groups and a molecular weight of less than 600 g/mol.

[5-1] A combination of the features of [5], [2] and [1-1] is preferred. [5-2] A combination of the features of [5], [2] and [1-2] is more preferred.

[6] The embossing lacquer according to any of the preceding points [1] to [5-2], wherein compound (A) contains a single (meth)acrylate group, compound (B) contains at least two (meth)acrylate groups, compound (C) contains at least two (meth)acrylate groups, and compound (D) contains a urethane (meth)acrylate group as the radical polymerizable group(s).

[7] The embossing lacquer according to any of the preceding points, wherein compound (B) consists of or contains

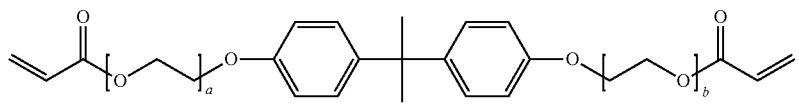

wherein a and b are independently from each other integers in the range of 3 to 25, preferably 5 to 25.

[7-1] The embossing lacquer of point [7], wherein compound (A) consists of or contains ortho-phenyl-phenol-ethyl-acrylate and compound (C) consists of or contains bisphenol-A-di (or tri)-ethoxy-di-methacrylate. Preferably, each of compounds (A) to (C) is based on or consists of the mentioned compounds.

[8] The embossing lacquer according to any of the preceding points, containing 20 to 70 parts by weight of compound (A), 10 to 50 parts by weight of compound (B), 10 to 50 parts by weight of compound (C), and 0 to 10 parts by weight of compound (D).

[8-1] A combination of the features of [1-1] and [8] is preferred. [8-2] A combination of the features of [1-3] and [8] is more preferred. [8-3] A combination of the features of [2], [1-3], and [8] may be preferred.

[9] The embossing lacquer according to any of the preceding points, containing 20 to 70 parts by weight of compound (A), 10 to 50 parts by weight of compound (B), 10 to 50 parts by weight of compound (C), and 1 to 10 parts by weight of compound (D).

[9-1] A combination of the features of [1-1] and [9] is preferred. [9-2] A combination of the features of [1-3] and [9] is more preferred. [9-3] A combination of the features of [2], [1-3], and [9] may be preferred.

[10] A method of preparing a polymerized embossing lacquer comprising a step of subjecting the embossing lacquer of any of points [1] to [9-3] to a radical polymerization reaction.

[11] A polymerized embossing lacquer obtainable by polymerizing the embossing lacquer of any of points [1] to [9-3] in a radical polymerization reaction.

[12] A decorative article comprising a support and a microstructure layer on the support, the microstructure layer being composed of an embossed and polymerized embossing lacquer of any of points [1] to [9-3].

[13] A method of preparing a decorative article containing a support and a microstructure layer, the method comprising (i) a step of applying the embossing lacquer of any of points [1] to [9-3] on a support to obtain a coated support, (ii) a step of embossing the embossing lacquer on the coated support to obtain an embossed lacquer layer, and (iii) a step of curing the embossed lacquer layer to obtain a microstructure layer and thus to obtain the decorative article.

[14] The method of point [13], wherein the method comprises a roll-to-roll process using a polymer film as a support.

[15] A decorative article obtainable by a method of point [13] or [14].

Advantages of the Invention

The embossing lacquer of the present invention can be embossed and polymerized to obtain a microstructure layer having an excellent balance of high optical dispersion and high flexibility and elasticity.

The embossing lacquer is radical polymerizable and can be conveniently polymerized by using UV light. The embossing lacquer is particularly advantageous for use in nanoimprint lithography (NIL) to result in a microstructure layer having the desired optical properties. In addition, the embossing lacquer has low viscosity and can be applied as thin uniform coating film on a support, for example, in a roll-to-roll (R2R) process.

Hence, the embossing lacquer of the present invention is particularly usable in R2R-UV-NIL processes.

EMBODIMENTS OF THE INVENTION

Figure 1:
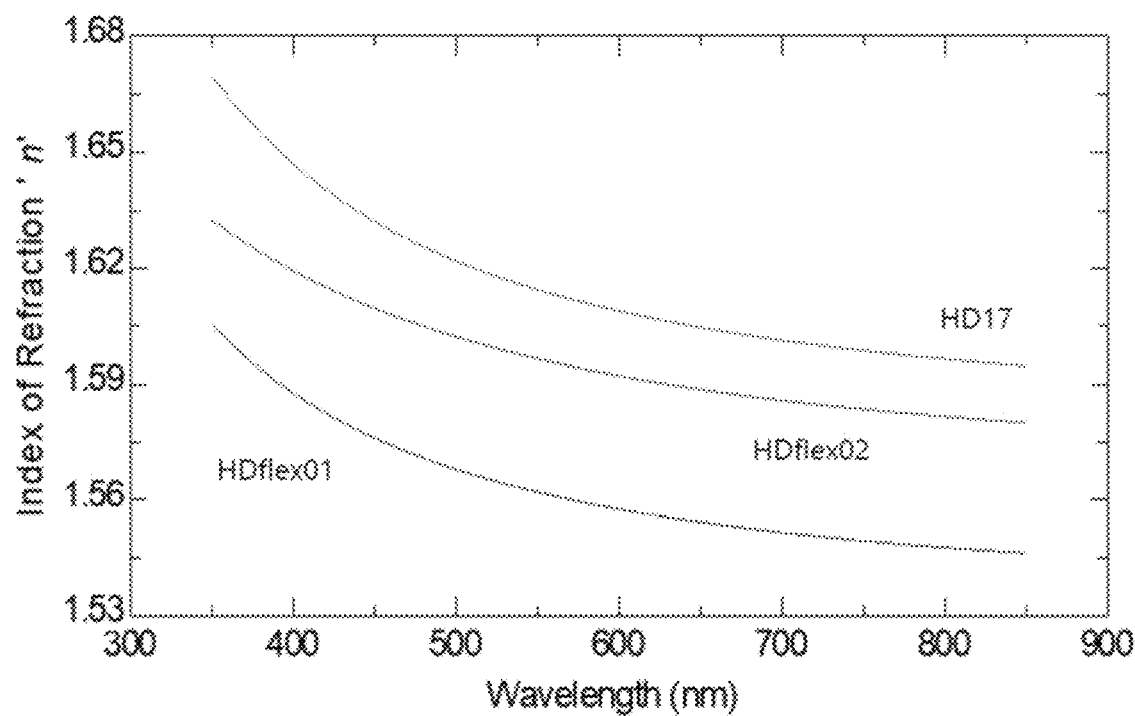
FIG. 1 shows the index of refraction of embossing lacquers NILcureHD17 ("HD17"), NILcureHDflex01 ("HDflex01"), and NILcureHDflex02 ("HDflex02") depending on the wavelength measured by spectral ellipsometry.

The embossing lacquer according to the present invention contains radical polymerizable compounds (A) to (D) that have an overall aromatic content of at least 20 wt % and may be crosslinked via long aliphatic chains.

The present invention provides a method of preparing a polymerized, i.e. cured, embossing lacquer comprising a step of subjecting the embossing lacquer to a radical polymerization reaction. The result of this method is a polymerized embossing lacquer according to the present invention.

The decorative article according to the present invention comprises a support and a microstructure layer on the support, wherein the microstructure layer is composed of an embossed and cured resin obtainable from the embossing lacquer of the present invention.

The decorative article according to the present invention may be prepared in a method comprising embossing and curing the embossing lacquer, wherein the method preferably involves a roll-to-roll process.

As used herein, the singular forms "a," "an," and "the" may be intended to include the plural forms as well, unless the context clearly indicates otherwise. For instance, components and compounds are generally described in the singular form, e.g. "a" compound or "containing a" compound. Such singular form formulations are meant to include more than one of the indicated compound or component, unless indicated otherwise.

The terms "comprises," "comprising," "including," and "having," are inclusive and therefore specify the presence of stated features, steps, operations, components and/or compounds, but do not preclude the presence or addition of one or more other features, steps, operations, components, compounds, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Herein, the term "acrylate" covers both an acrylate and a (meth)acrylate group, unless indicated otherwise.

Whenever it is mentioned in the context of this description that individual components or elements are based on or made of a certain material, this should be interpreted as the respective material forming the main constituent of the component, wherein other constituents may also be present in small quantities. In embodiments, the terms "based on" or "made of" a certain material means a content of more than 50 wt %, preferably 90 wt %, and more preferably 95 wt %.

The term "and/or" includes any and all combinations of one or more of the associated listed items.

Embossing Lacquer and Microstructure

The embossing lacquer of the present invention has a high aromatic content. Generally, a high aromatic content results in a high refraction index and high optical dispersion of the polymerized, i.e. cured, embossing lacquer. The use of a material with high optical dispersion is advantageous since it increases the colour split that occurs when white light is refracted at the facets of an embossed microstructured layer. A high optical dispersion of the polymerized material corresponds to a low Abbé number. The Abbé number of a material may be determined for example by ellipsometry. In particular, the refractive index of the material at multiple wavelengths at least within the visible range may be measured for example using variable angle spectroscopic ellipsometry, and the Abbé number may be calculated as follows:

$$v_e = \frac{n_e - 1}{n_{F'} - n_{C'}}$$

where $n_e$, $n_{F'}$ and $n_{C'}$ are the refractive indices of the material at the wavelengths of the Fraunhofer e—(Hg light source), F'—(Cd light source) and C'—(Cd light source) spectral lines (546.07 nm, 479.99 nm and 643.86 nm respectively).

Preferably, the polymerized embossing lacquer of the present invention has an Abbé number below 60, preferably below 50, below 40 or below 35.

The embossing lacquer of the present invention contains compound (A) and compound (B) as mandatory components and compound (C) and/or compound (D) as optional components. The embossing lacquer may be polymerized, i.e. cured, in a radical polymerization reaction. Compounds (A) to (D) are radical (co)polymerizable compounds to form polymer chains and crosslinks between the chains in a radical polymerization reaction. The term "radical polymerizable" means that a compound contains one or more functional groups providing sites for electromagnetic radiation initiated free radical polymerization. The free radical polymerization occurs under the influence of electromagnetic radiation such as ultra violet (UV) light. Hence, the radical polymerizable compounds are light curable, in particular UV-curable. Each of compounds (A) and (B) and, if present, compounds (C) and (D) contains at least one group that is copolymerizable with at least one group of each of the other compounds in a radical polymerization reaction. Such a group is a carbon-carbon double bond. In each of compounds (A) to (D), the radical polymerizable group is preferably a terminal group, i.e. a vinyl group, e.g. in a (meth)acrylate group.

Herein, each of compounds (A) to (D) may be independently of the other compounds a monomer, oligomer of polymer, if not expressly stated otherwise. Preferably, compounds (A) and (C) are monomers. Herein, the term "radical polymerizable compound" refers to all of the polymerizable compounds (A) to (D) and to each independently, if not stated otherwise.

Compound (A) is a non-crosslinking compound, compounds (B) and (C) are crosslinking compounds, compound (D) may be a crosslinking or a non-crosslinking compound.

Herein, non-crosslinking compounds are compounds which, in addition to their ability to react with other compounds in a radical polymerization reaction to enable chain extension thus forming a linear polymer, have no additional functionality to react with other compounds in the radical polymerization reaction. Hence, a non-crosslinking radical polymerizable compound is a compound capable of participating in chain extension but not capable of forming crosslinks between the chains in a radical polymerization reaction. In other words, "non-crosslinking" means "not capable of forming crosslinks". In terms of their ability to react with other monomers, oligomers or polymers, non-crosslinking compounds are bifunctional in the sense that they can react with exactly two radical polymerizable groups to enable chain extension. For example, a group containing a single carbon-carbon double bond may be a bifunctional group. Hence, an example of a non-crosslinking compound contains a single (meth)acrylate.

Herein, crosslinking compounds are compounds which, in addition to their ability to react with other compounds in a radical polymerization reaction to enable chain extension thus forming a linear polymer, have a functionality that enables them to react with other compounds in the radical polymerization reaction thus forming crosslinks between polymer chains. In other words, "crosslinking" means "capable of forming crosslinks". Crosslinking compounds are thus more than bifunctional with respect to their ability to react with other monomers, oligomers or polymers. In the radical polymerization reaction used in the present invention, an example of a crosslinking compound is a compound containing at least two carbon-carbon double bonds such as at least two (meth)acrylates.

The polymerizable group in the radical polymerizable compounds (A) to (D) may be a carbon-carbon double bond which may be selected from the group consisting of acrylates, methacrylates, vinyl ethers, allyl ethers, propenyl ethers, alkenes, dienes, unsaturated esters, ally triazines, allyl isocyanates, and N-vinyl amides. Using these compounds, a rapid reaction with bi-radical oxygen molecules occurs within a radical polymerization initiated by the photoinitiator. The radical polymerizable compound may be a prepolymer that may be selected from the group consisting of urethane acrylates, vinyl acrylates, epoxy acrylates, polyester acrylates, polyacrylates, polyether acrylates, and polyolefin acrylates. Urethane acrylates may be preferred. Urethane acrylates which are useful in the present invention preferably are urethane acrylate oligomers. Urethane acrylate oligomers with a molecular weight between approx. 300 g/mol and 2500 g/mol may be used as a mono or oligomer component with at least one polymerizable double bond. An especially preferred class of urethane acrylate oligomers includes di- or higher functional acrylate esters of hydroxyl-terminated NCO extended polyesters or polyethers which can be aliphatic or aromatic. The use of urethane acrylates allows to specifically provide a prepolymer composition, which allows a consistent layer thickness to be achieved, which is free of irregularities, for a subsequent coating or application of the polymer layer compared to conventional layers.

This prepolymer composition has easily processable viscosities. To ensure that on the one hand the viscosity is not too high and on the other hand the layer does not become too thick or, in particular, acrylate monomers or vinyl ester monomers may be added to the urethane acrylate oligomers with a higher molecular weight as reactive diluents in order to achieve even layer thicknesses and, in particular, to not raise the viscosity too much.

Acrylated epoxy materials which are useful in the present invention preferably are acrylate epoxy oligomers. Acrylated epoxy oligomers include, for example, di- or higher functional acrylate esters of epoxy resins such as the diacrylate esters of bisphenol A epoxy resin. Acrylated epoxy resins tend to improve the tensile strength and elongation at break of the polymeric material obtained by curing the UV-curable precursor. Polyacrylates are acrylic oligomers or polymers that have reactive pendant or terminal acrylic acid groups capable of forming free radicals for subsequent reaction. Polyacrylate materials which are useful in the present invention preferably are polyacrylate polymers. Like the acrylated epoxy materials, the polyacrylates generally improve the tensile strength of the material obtainable by curing the UV-curable precursor. Similarly, acrylated olefin oligomers or polymers are unsaturated oligomeric or polymeric materials having reactive pendant or terminal acrylic acid groups capable of forming free radicals for crosslinking or chain extension. The acrylated olefins generally tend to improve the tensile strength and the elongation at break of the material obtained by curing the UV-curable precursor. Examples of useful acrylated olefins include polybutadiene acrylic oligomers. Polyester acrylate oligomers or polymers suitable in the present invention can be generally prepared by condensation reactions between acrylic acid and polyols or polyesters, respectively. Acrylated polyether resins tend to improve the flexibility and elongation at break of the elastomeric material obtained by curing the UV-curable precursor. Silicone acrylate oligomers or polymers tend to improve the elasticity and elongation of the structured surfaces but impair their tensile strength and robustness. Higher functional silicone acrylates are often used due to their low surface energy properties.

The mechanical properties of the resulting structured surface are affected not only by the chemical composition of the curable oligomer or polymer but also by the respective crosslinking density. A higher crosslinking density usually results in a harder and more brittle material whereas a lower crosslinking density results in a softer and more conformable material.

The radical polymerization used to polymerize the radical polymerizable compounds (A) to (D) may also comprise or consist of a thiol-ene reaction, i.e., a reaction of a thiol group with a carbon-carbon double bond.

The polymerizable groups in each of radical polymerizable compounds (A) to (D) or in the composition containing compounds (A) to (D) may be a mixture of thiol groups and carbon-carbon double bonds.

The radical polymerizable compound used in the present invention may contain a component having at least two thiol groups in addition to a component, e.g. a prepolymer, containing a carbon-carbon double bond. The double bonds of the prepolymer may react with the thiol-containing component to form a polymer. For instance, non-crosslinking compound (A) may be a mixture of compounds having exactly two thiol groups and compounds having exactly two carbon-carbon double bonds. For example, a monomer having exactly two thiol groups is glycol di(3-mercaptopropionate) (GDMP). Other examples of compounds containing thiol groups are 3-Mercaptopropionates, 3-Mercaptoacetates, thioglycolates, and alkylthiols. In compound (A), the multifunctional monomer component having at least two thiol groups may be contained in a quantity of 1 to 50 wt % particularly of 5 wt % to 30 wt % and mono or oligomer components having at least two polymerizable double bonds may be contained in a total quantity of 1 wt % to 90 wt %, particularly of 10 wt % to 50 wt %.

The embossing lacquer preferably has a viscosity of 0.01 to 10 Pa·s, more preferably 10 to 2000 mPa·s, most preferably 50 to 1000 mPa·s. A viscosity within this range results in a good fluidity of the embossing lacquer and a uniform coating of surfaces. In the present invention, the viscosity is measured at 23° C. according to DIN EN ISO 2555 (Brookfield method).

Compound (A)

Compound (A) may be a single species of compound or a mixture of compounds each falling within the definition of compound (A).

Compound (A) is a non-crosslinking radical polymerizable compound and has a very high aromatic content. For instance, compound (A) may have an aromatic content of at least 50 wt %, at least 60 wt %, or at least 70 wt %.

Compound (A) contributes to increasing the refractive index and dispersion of the cured resin, and lowering the viscosity of the uncured resin. Compound (A) may have a viscosity at room temperature below 200 mPa·s.

In embodiments, compound (A) may contain a single (meth)acrylate group. Suitable monomers for use as compound (A) may include ortho-phenyl-phenol-ethyl-acrylate (available as MIWON Miramer M1142, refractive index RI(ND25)=1.577, viscosity at 25° C.=110-160 mPas) and 2-phenoxyethyl-acrylate (available as MIWON Miramer M140, refractive index RI(ND25)=1.517, viscosity at 25° C.=10-20 mPas). Further suitable monomers include phenylepoxyacrylate (available as MIRAMER PE 110), benzylacrylate (available as MIRAMER M1182), benzylmethacrylate (available as MIRAMER M1183), phenoxybenzylacrylate (available as MIRAMER M1122) and 2-(phenylthio)ethylacrylate (available as MIRAMER M1162). In preferred embodiments, the composition comprises ortho-phenyl-phenol-ethyl-acrylate as the only compound (A).

Compound (B)

Compound (B) may be a single species of compound or a mixture of compounds each falling within the definition of compound (B).

Compound (B) is a crosslinking radical polymerizable compound and has an aliphatic chain between the groups capable of crosslinking. Due to its crosslinking functionality, compound (B) contributes to the thermal, mechanical and/or chemical stability of the cured resin.

Compound (B) is capable of forming crosslinks via one or more aliphatic chain(s). Herein, an aliphatic chain is a linear organic structure not containing aromatic groups and not containing cyclic groups. The aliphatic chain is not restricted to hydrocarbons but covers chains having oxygen and/or sulfur in addition to carbon in the main chain. The main chain may be constituted by at least eight atoms, preferably at least ten atoms connected via single bonds, said atoms being carbon atoms and optionally oxygen and/or sulfur atoms. The main aliphatic chain may be branched or unbranched. Its main chain is preferably fully saturated, i.e. it contains no alkenyl or alkynyl groups. Each of the aliphatic chains is independently selected from the group consisting of polyether, polythioether, polyester, polythioester, polyacetate, polycarbonate and hydrocarbon. Herein, a polymer such as a polyether etc. denotes a molecule having at least two repeating units. Hence, the term "polyether" and the like cover both oligoethers and polyethers, if not explicitly stated otherwise. Preferably, the one or more aliphatic chain(s) is/are selected from the group consisting of polyether, polythioether, polyester, polythioester, polyacetate, and polycarbonate. Preferably, these polymers contain at least three, more preferably at least six repeating units. More preferably, the aliphatic chain is a polyether having at least three or at least six repeating units, e.g. ethoxy units. Even more preferred is compound (B) having one or two aliphatic polyethers each having at least three or at least six ethoxy repeating units, wherein the total content of said polyether(s) is at least 50 wt %. The total content of the one or more aliphatic chain(s) of compound (B) based on the total of compounds (A) to (D) is preferably at least 8 wt %. The crosslinks are formed between at least two main chains of the polymer formed e.g. by compounds (A). The crosslinking part is the part between the two functionalities that are incorporated into the main chain of the polymer. For instance, if compound (B) contains two vinyl groups, i.e. terminal carbon-carbon double bonds, the crosslinking part is all of compound (B) except for the two vinyl groups. The crosslinking part mandatorily contains the "one or more aliphatic chain(s) having a molecular weight of 120 to 2000 g/mol" in its main chain and optionally contains other groups that are not aliphatic and/or linear, e.g. aromatic groups or (hetero)cyclic aliphatic groups, or aliphatic but having a having a molecular weight of less than 120 g/mol, e.g. an ethylene group. The content of the aliphatic chain(s) in compound (B) is at least 40 wt %, preferably at least 50 wt % and more preferably at least 60 wt %. For instance, the crosslinking part may contain two of said aliphatic chains separated by one or more aromatic groups, e.g. BPA(EO) 10DA (bisphenol-A-deca-ethoxy-di-acrylate). In BPA(EO) 10DA, the content of the aliphatic chains is about 60 wt %.

Compound (C)

Compound (C) may be a single species of compound or a mixture of compounds each falling within the definition of compound (C).

Compound (C) is a crosslinking radical polymerizable compound having no aliphatic chain between the groups capable of crosslinking. Similar to compound (B), compound (C) contributes to the thermal, mechanical and/or chemical stability of the cured resin.

Compound (C) may have a viscosity at room temperature above 1,000 mPas and may have a refractive index of at least about 1.51. Suitable monomers include ethoxylated(3)bisphenol-A-dimethacrylate (available as Sartomer SR348C, refractive index RI(ND25)=1.53). Further suitable monomers include ethoxylated (2)bisphenol-A-dimethacrylate (available as Sartomer SR348L, viscosity at 60° C.=1,600 mPas, refractive index similar to that of ethoxylated(3) bisphenol-A-dimethacrylate); ethoxylated (3)bisphenol-A-diacrylate (available as Sartomer SR349 or Miwon MIRAMER 244); ethoxylated (4)bisphenol-A-diacrylate (available as Miwon MIRAMER M240); bisphenol-A-diepoxyacrylate (available as Miwon MIRAMER PE210, viscosity at 60° C.=5000 mPas); and bisphenol-A-diepoxymethacrylate (available as Miwon MIRAMER PE250, viscosity at 60° C.=5,000 mPas). In preferred embodiments, the (meth)acrylate monomers may be selected to have a viscosity at 60° below about 3,000 mPas, preferably below about 2,000 mPas. In preferred embodiments, the curable resin composition comprises ethoxylated(3)bisphenol-A-dimethacrylate as the only compound (C).

Compound (D)

Compound (D) may a crosslinking or a non-crosslinking compound. Compound (D) be a single species of compound or a mixture of compounds each falling within the definition of compound (D). Suitable monomers include aromatic urethane diacrylate oligomers such as Allnex Ebecryl 210 (E210; refractive index approx. RI(ND25)=1.52).

Photoinitiator

The embossing lacquer according to the present invention may contain a photoinitiator. The photoinitiator may be contained in a concentration of at least 0.1 wt %, preferably between 0.5 and 3 wt % of the total weight of the embossing lacquer. Suitable photoinitiators for use in the invention include ethyl(2,4,6-trimethylbenzoyl)-phenyl phosphinate (TPO-L); blends of bis(2,6-dimethoexybenzoyl)-2,4,4-trimethyl pentylphosphineoxide and 1-hydroxy-cyclohexyl-phenyl-ketone; 2,4,6-trimethylbenzoyldiphenylphosphine oxide; benzil dimethyl ketal 2,2-methoxy-1,2-diphenyl ethanone; 2-hydroxy-2-methyl-1-phenyl-propan-1-one (DMHA); 1-hydroxycyclohexyl phenyl ketone (Irgacure 184); and blends of 1-hydroxy-cyclohexylphenyl-ketone and benzophenone (Additol BCPK). Amongst these, compounds such as, Irgacure 184, DMHA and Additol BCPK may be advantageous as they may result in a microstructure layer being fully transparent in the complete visible spectrum. Further, the use of blends such as Additol BCPK increase the adhesion of the microstructure layer to supports such as PET or PE.

Other Additives

The embossing lacquer of the present invention may contain other additives to allow for easier processing or to provide certain desired properties to the embossing lacquer or the cured polymer or the microstructure layer. Examples of such additives are colorants, rheology agents, levelling agents, anti-skin agents, UV stabilizers, antioxidants, and anti-foam additives.

Surface-Active Anti-Adhesive Additive

In embodiments, the embossing lacquer of the present invention does not comprise a surface-active anti-adhesive additive, which may herein simply be referred to as a surfactant.

Compositions without surfactant may result in good adhesion between the microstructure layer and the support. In particular, the bond between the cured embossing lacquer of the microstructure layer and the support may be resistant to exposure to temperature changes and/or humidity.

Preferably, the embossing lacquer contains at least one surfactant to reduce or completely prevent adhesion of the embossing lacquer to the embossing tool such as an embossing stamp in the embossing step. The surfactant contained in the embossing lacquer is preferably a compound not falling within the definition of any of compounds (A) to (D) and has the effect of lowering the surface energy of the embossing lacquer. Hence, the surface energy of the embossing lacquer containing the surfactant is lower than the surface energy of the embossing lacquer free of the surfactant.

Generally, the surfactant may be contained in the embossing lacquer (i) as a component in addition to compounds (A) to (D) and/or (ii) as a constituent of at least one of compounds (A) to (D). In the case of (i), it is preferably copolymerizable with compounds (A) to (D) in the radical polymerization reaction in the method of the present invention to enable the incorporation of the surfactant into the polymer network. To that end, the surfactant may contain a functionalization such as a carbon-carbon double bond. Preferably, the surfactant is a (meth)acrylate functionalized compound. In the case of (ii), it structurally differs from the other constituents of the compound containing it.

The surfactant may be at least one member selected from the group comprising silicone-containing or fluorine-containing additives. Specific examples include non-ionic surfactants such as polyether siloxanes, fatty alcohol ethoxylates such as polyoxyethylene (9) lauryl ether, monofunctional polydimethylsiloxane (meth)acrylates, perfluoro n-alkyl (meth)acrylates, and perfluoropolyether (meth)acrylates. Silicone-containing or fluorine-containing additives help reduce adhesion to and facilitate release of the cured embossing lacquer from the embossing tool, with the perfluorinated additives in particular having proven to be particularly favorable and to reliably allow a plurality of impressions of a pattern. Preferably, the surfactant may be at least one member selected from the group consisting of alkyl (meth)acrylates, polysiloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers. Specific surfactants include 1H,1H,2H,2H-perfluorooctyl acrylate; 1H,1H,5H-octafluoropentyl-acrylate; (PFPE)-urethane acrylate; polyether-modified poly-dimethylsiloxane; and 4-(1,1,3,3-tetramethylbutyl)-phenyl-poly-ethylene glycol. These surfactants are advantageously colourless (clear) and enable the production of a cured polymer on a support surface (such as a PET or PE surface) that shows satisfactory adhesion to the surface.

The embossing lacquer may contain a surfactant in a quantity of 0.01 wt % to 5 wt %, particularly 0.1 wt % to 3 wt % to ensure a reduction of the surface energy of the embossing lacquer to a suitable extent.

The surfactant is preferably chosen such that when the resin composition is applied on a polymeric surface such as PE or PET, the surfactant segregates more at the exposed resin surface than at the polymer-resin interface. In embodiments, the surfactant does not reduce the transparency of the cured resin composition.

The adhesion of the embossing lacquer to the embossing tool can also be prevented by modifying the surface of the embossing tool, in particular of the embossing die, with regard to its hydrophobicity.

In the method of preparing a decorative article according to the present invention, adhesion of the embossing lacquer to the embossing tool can be reduced by using a surface-active anti-adhesion additive and/or a surface hydrophobicity-modified embossing tool.

Reactive Diluents

Each of compounds (A) to (D) may be an oligomer or a polymer. In that case, the viscosity of the embossing lacquer may be too high. Conventionally, the viscosity of an embossing lacquer is reduced by the addition of reactive diluents copolymerizable with the other polymerizable components of the embossing lacquer. Reactive diluents may have a low molecular weight of e.g. less than 500 g/mol, such as acrylate monomers. Thus, the viscosity of an embossing lacquer can be adjusted by varying the content of reactive diluent.

In the embossing lacquer of the present invention, compounds (A) and (C) are preferably low molecular compounds. In particular, compound (A) has a preferred molecular weight of less than 350 g/mol and may thus function as a reactive diluent. Hence, the compounds of the embossing lacquer of the present invention can be suitably selected to avoid the necessity of adding any reactive diluent in addition to compounds falling within the definition of any of compounds (A) to (D). In a preferred embodiment, the embossing lacquer of the present invention does not contain any radical polymerizable compound having a molecular weight of less than 500 g/mol and not falling within the definition of any of compounds (A) to (D).

Support

The support is a substantially flat structure, such as a panel, sheet or film of material.

The support may be made of any material. For instance, the support may be made of a material selected from glass, such as crystal glass, ultrathin glass, chemically strengthened glass, or an organic polymer such as PET (polyethylene terephthalate), PMMA (poly(methyl methacrylate)), or PE (polyethylene), or combinations thereof, such as one or more layers of glass and/or one or more layers of polymers. For example, the support may be a safety glass panel comprising two layers of glass separated by a layer of transparent elastomeric material. Preferably, the support is a flexible film made of an organic polymer such as PET, PMMA or PE. The use of a flexible film allows the preparation of the decorative article in a roll-to-roll process.

The support may be transparent, i.e. it allows the transmission of light, preferably at least visible light. Preferably, the material is transparent in the conventional sense, i.e. allowing (at least visible) light to pass through the material without being scattered.

The microstructure layer may be transparent. The decorative article of the present invention may comprise a transparent support and a transparent microstructure layer and may be transparent as a whole.

The support may comprise a reflective or semi-transparent reflective layer on the surface of the application of the microstructure layer or on the back-surface or on both surfaces. The reflective layer is configured to reflect at least some of the light that is incident on and/or passes through the microstructure. The reflective layer may be a layer made of metal, preferably silver and/or aluminium, or a plurality of layers made of material forming a dielectric mirror. The at least partially reflective layer may be applied by physical vapour deposition (PVD) or chemical vapour deposition (CVD). The thickness of the reflective layer may be 20 nm to 1 µm. The reflective layer may be flexible.

The decorative article may comprise two superimposed microstructures separated from each other by the support and/or the at least partially reflective layer. In that case, the decorative article as such may be the support for the application of the second microstructure layer.

The support may be a flexible film made of an organic polymer and having a thickness of at most 2 mm, preferably at most 1 mm, or at most 500 µm. Preferably, the film has a thickness of 100 µm to 500 µm, or 100 µm to 200 µm. The flexible film may comprise a thin and thus flexible reflective layer.

The flexible film, optionally coated with flexible reflective layer, supporting the flexible microstructure layer, i.e. the decorative article of the present invention, can be advantageously applied on a flexible material such as a textile or (artificial) leather.

In addition to being flexible, the film used as support is preferably elastic. Since the microstructure layer is elastic, too, the decorative article of the present invention can be advantageously applied on an elastic material such as a textile.

Other Layers

As discussed above, the decorative article of the present invention may comprise at least one partially or totally reflective layer.

In addition, the decorative article of the present invention may comprise a protective layer protecting the decorative article, and in particular the microstructure layer on the decorative article, from mechanical and/or chemical damage. The protective layer may comprise a lacquer selected from the group consisting of: epoxy lacquers, one component polyurethane lacquers, bi-component polyurethane lacquers, acrylic lacquers, UV-curable lacquers, and sol-gel coatings. The protective layer may optionally be pigmented. The protective layer may have a thickness of 4 to 14 μm and may be applied by spraying, digital printing, rolling, curtain coating or other two-dimensional application methods.

Preparation Process

The present invention relates to a method of preparing a decorative article containing a support and a microstructure layer, the method comprising (i) a step of applying the embossing lacquer of the present invention on a support to obtain a coated support, (ii) a step of embossing the embossing lacquer on the coated support to obtain an embossed lacquer layer, and (iii) a step of curing the embossed lacquer layer to obtain a microstructure layer and thus to obtain the decorative article. Preferably, the method comprises a roll-to-roll process using a polymer film as a support. In particular, step (ii) may be carried out in a roll-to-roll process.

Furthermore, the present invention relates to a method of preparing a polymerized embossing lacquer comprising a step of subjecting the embossing lacquer of the present invention to a radical polymerization reaction. This method is carried out is step (iii) of the above method.

A microstructure layer may be formed by applying a layer of the embossing lacquer on a planar surface of a support, and embossing a microstructure into the layer of the embossing lacquer using a stamp. The stamp may be provided on a roller.

In step (i), the embossing lacquer may be applied onto a planar surface of a support using a roller. The support may be provided on a roller and step (ii) of embossing the microstructure may be performed using a roll-to-roll process. The embossing lacquer is cured during or after embossing. Preferably, the embossing lacquer is cured at the same time as embossing. The radical polymerizable compounds may be polymerized, i.e. cured, using electromagnetic radiation, e.g. UV light.

The stamp may be made of a polymer material such as polyurethane-acrylate resin or PDMS (polydimethylsiloxane), or a metal-containing material such as nickel or nickel phosphorus alloy. The stamp may have a surface roughness Ra below about 100 nm, preferably below about 50 nm, below about 20 nm, below about 10 nm, or below about 5 nm. The stamp may have a flatness deviation df below 2 μm, preferably below 1 μm, below 800 nm, below 500 nm or below 200 nm.

The thickness of the layer of the embossing lacquer may be between 30 μm and 200 μm, such as between 50 μm and 150 μm.

Preferably, the embossing lacquer may be cured at least partially by exposing the embossing lacquer to electromagnetic radiation through the support. In that case, the support is preferably transparent to the electromagnetic radiation in a wavelength range suitable to cure the embossing lacquer.

An at least partially reflective layer may be provided on the microstructure and/or one or the planar surfaces of the support prior to or after forming the microstructure.

EXAMPLES

Embossing lacquers of various compositions were prepared and their optical and physical properties were compared. The following compounds were used to prepare the embossing lacquers:

OPPEA (ortho-phenyl-phenol-ethoxy-acrylate; Miwon, M1142) is representative of compound (A) contained in the embossing lacquer of the present invention:

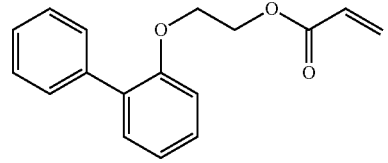 [SMILES: C=CC(=O)OCCOc1ccccc1-c1ccccc1]

BPA(EO)10DA (bisphenol-A-deca-ethoxy-di-acrylate) is representative of compound (B) contained in the embossing lacquer of the present invention:

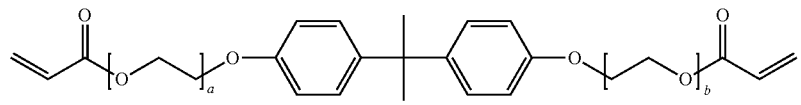

wherein a and b are independently from each other integers in the range of 3 to 25.

BPA(EO)2DMA (bisphenol-A-di-ethoxy-di-methacrylate; Sartomer SR348L) is representative of compound (C) optionally contained in the embossing lacquer of the present invention:

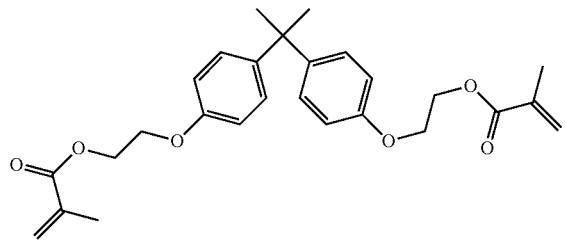 [SMILES: C=C(C)C(=O)OCCOc1ccc(C(C)(C)c2ccc(OCCOC(=O)C(=C)C)cc2)cc1]

Ebecryl 210 (Allnex E210) is an aromatic urethane diacrylate oligomer having a refractive index (ND25) of about 1.52)

TPO-L (ethyl (2,4,6-trimethylbenzoyl) phenylphosphinate) is a liquid photoinitiator having high absorption in the UV-A range.

Table 1 shows the compositions of embossing lacquers and the optical and mechanical properties of the cured embossing lacquers.

TABLE 1

|  | NILcureHD17 (comparative) | NILcureHDflex01 (inventive) | NILcureHDflex02 (inventive) |
|---|---|---|---|
| Composition of embossing lacquer (wt %) | | | |
| OPPEA | 65.3 | 32.7 | 50 |
| BPA(EO)2DMA | 32.7 | 32.7 | 28 |
| BPA(EO)10DA |  | 32.6 | 15 |
| Ebecryl 210 |  |  | 5 |
| TPO-L | 2 | 2 | 2 |
| Properties of the cured embossing lacquer | | | |
| nD25 liquid | 1.564 | 1.544 | 1.547 |
| Abbé number | 30 | 34.5 | 37.5 |
| Younq's modulus [MPa] | 1500 | 400 | 960 |
| Tensile strength [MPa] | 36 | 23 | 36 |
| Elongation at break [%] | 4 | 35 | 33 |

NILcureHD17 is disclosed in WO 2021/009381 A1 and is a comparative embossing lacquer. The cured embossing lacquer of formulation NILcureHD17 shows high optical dispersion, solvent resistance and tensile strength. The two aromatic benzene rings in BPA(EO)2DMA are rigid structures and, together with the tight crosslinking, this inevitably leads to low elasticity or high brittleness of the cured product.

In the embossing lacquer NILcureHDflex01 according to the present invention, the aromatic monomer BPA(EO)2DMA contained in NILcureHD17 was partly replaced with BPA(EO)10DA containing flexible polyethoxy chains. These flexible polyethoxy chains between the aromatic core responsible for the high optical dispersion and the reactive acrylate groups cause a significant increase in the elasticity of the cured product while maintaining high optical dispersion, solvent resistance and tensile strength.

In the embossing lacquer NILcureHDflex02 according to the present invention, an aromatic urethane acrylate (Ebecryl 210) was added to improve substrate adhesion.

FIG. 1 shows the optical dispersion of the three embossing lacquers measured by spectral ellipsometry. The Abbe number (Table 1) was calculated from the optical dispersion as described above.

The data of Table 1 show that the cured embossing lacquers according to the present invention show high elasticity. The refractive index and the optical dispersion are somewhat lower than in the comparative product due to the reduction of the aromatic fraction.

Figure 2A:
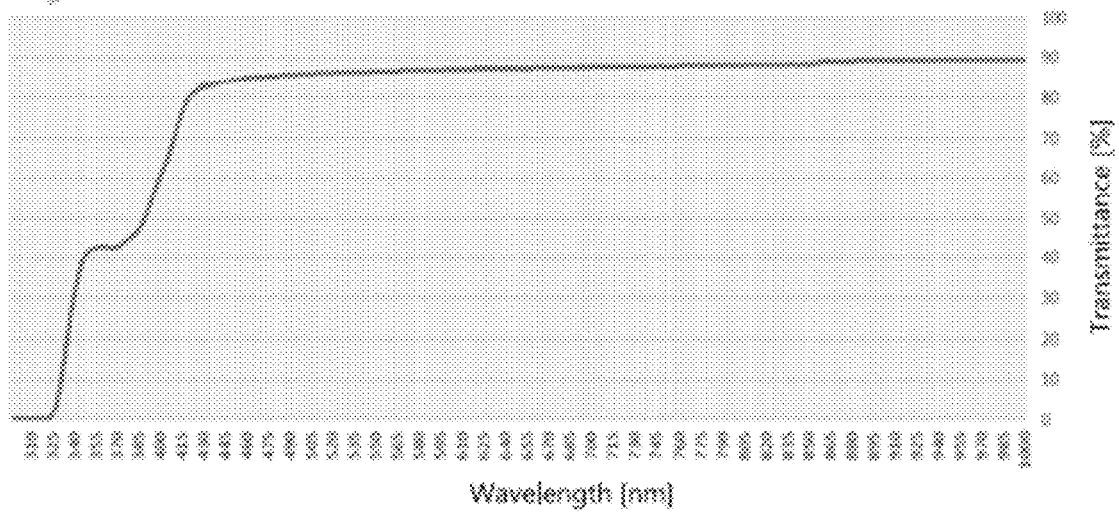
FIGS. 2A to 2C show the UV-Vis transmission transmission spectra of NILcureHD17 (FIG. 2A), NILcureHDflex01 (FIG. 2B), and NILcureHDflex02 (FIG. 2C).
Figure 2B:
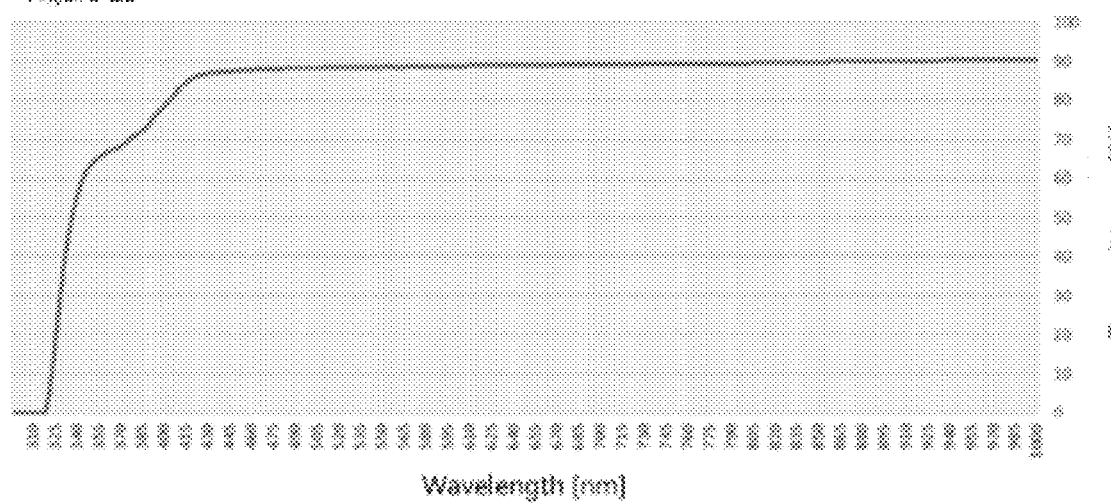
Figure 2C:
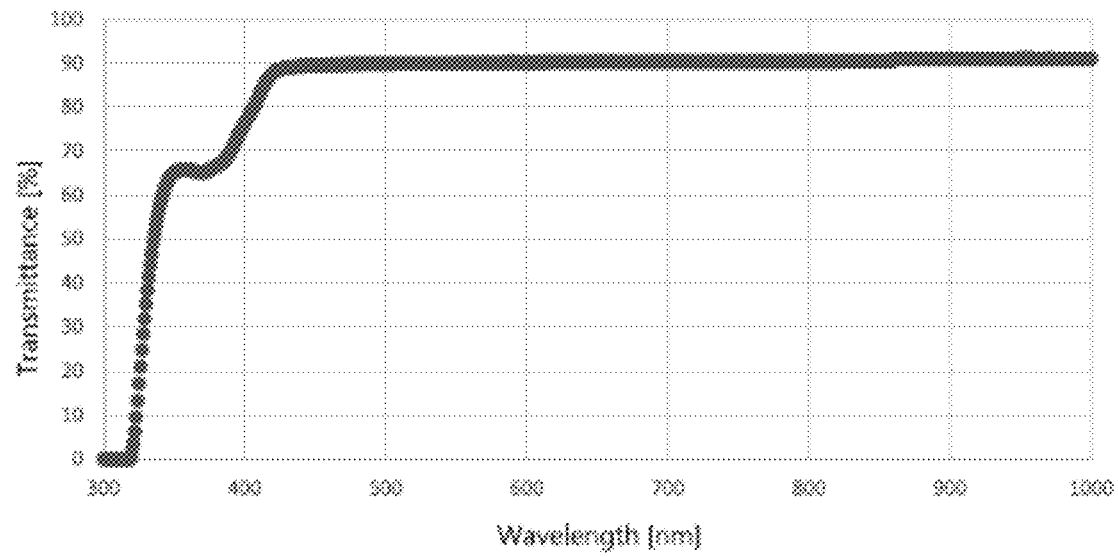

FIGS. 2A to 2C show that the cured embossing lacquers have full optical transparency in the visible wavelength range down to 430 nm. The lack of transmission (approx. 90% instead of 100%) in the visible range is caused by Fresnel reflection on both surfaces of the films, and the transmission dip in the UV-A range at about 380 nm is caused by the TPO-L photoinitiator.

What is claimed is:

1. An embossing lacquer containing a total of 100 parts by weight of the following radical polymerizable compounds (A) to (D) that have an overall aromatic content of at least 20 wt %:
   20 to 70 parts by weight of compound (A), which is a non-crosslinking compound in a radical polymerization reaction and has an aromatic content of at least 40 wt %,
   10 to 50 parts by weight of compound (B), which is a crosslinking compound in a radical polymerization reaction forming crosslinks via one or more aliphatic chain(s) each having a molecular weight of 120 to 2000 g/mol and each being selected from the group consisting of polyether, polythioether, polyester, polythioester, polyacetate, polycarbonate, and hydrocarbon, wherein the content of the aliphatic chain(s) in compound (B) is at least 40 wt %,
   10 to 50 parts by weight of compound (C), which is a crosslinking compound in a radical polymerization reaction and has an aromatic content of at least 30 wt % and does not fall within the definition of compound (B), and
   0 to 10 parts by weight of compound (D), which does not fall within the definition of any of compounds (A) to (C) and has a urethane group;
wherein:
   compounds (A) to (D) constitute at least 90 wt % of the embossing lacquer.

2. The embossing lacquer according to claim 1, wherein compound (A) contains a single polymerizable carbon-carbon double bond and compound (B) contains two or more polymerizable carbon-carbon double bonds.

3. The embossing lacquer of claim 1, wherein the aromatic content in compounds (A) to (D) is constituted by phenyl groups.

4. The embossing lacquer according to claim 1, wherein compound (B) contains two polyether chains as the aliphatic chains, wherein the two polyether chains are separated by a residue containing at least two aromatic groups.

5. The embossing lacquer according to claim 1, wherein compound (A) has at least two aromatic groups and a molecular weight of less than 350 g/mol, compound (B) has a molecular weight of 600 g/mol to 2000 g/mol and contains two polyether chains as the aliphatic chains, wherein the two polyether chains are separated by a residue containing two aromatic groups, and compound (C) has at least two aromatic groups and a molecular weight of less than 600 g/mol.

6. The embossing lacquer according to claim 1, wherein compound (A) contains a single (meth)acrylate group, compound (B) contains at least two (meth)acrylate groups, compound (C) contains at least two (meth)acrylate groups, and compound (D) contains a urethane (meth)acrylate group as the radical polymerizable group(s).

7. The embossing lacquer according to claim 1, wherein compound (B) is

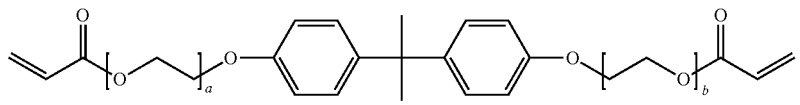

wherein a and b are independently from each other integers in the range of 3 to 25.

8. The embossing lacquer according to claim 1, containing 20 to 70 parts by weight of compound (A), 10 to 50 parts by weight of compound (B), 10 to 50 parts by weight of compound (C), and 1 to 10 parts by weight of compound (D).

9. A method of preparing a polymerized embossing lacquer comprising a step of subjecting the embossing lacquer of claim 1 to a radical polymerization reaction.

10. A polymerized embossing lacquer obtainable by polymerizing the embossing lacquer of claim 1 in a radical polymerization reaction.

11. A decorative article comprising a support and a microstructure layer on the support, the microstructure layer being composed of an embossed and polymerized embossing lacquer of claim 1.

12. A method of preparing a decorative article containing a support and a microstructure layer, the method comprising
   (i) a step of applying the embossing lacquer of claim 1 on a support to obtain a coated support,
   (ii) a step of embossing the embossing lacquer on the coated support to obtain an embossed lacquer layer, and
   (iii) a step of curing the embossed lacquer layer to obtain a microstructure layer and thus to obtain the decorative article.

13. The method of claim 12, wherein the method comprises a roll-to-roll process using a polymer film as a support.

14. A decorative article obtainable by a method of claim 12.

* * * * *